United States Patent
Kim et al.

(10) Patent No.: US 9,520,493 B1
(45) Date of Patent: Dec. 13, 2016

(54) HIGH VOLTAGE INTEGRATED CIRCUITS HAVING IMPROVED ON-RESISTANCE VALUE AND IMPROVED BREAKDOWN VOLTAGE

(71) Applicant: SK hynix Inc., Gyeonggi-do (KR)

(72) Inventors: Dae Hoon Kim, Gyeonggi-do (KR); Se Kyung Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/130,790

(22) Filed: Apr. 15, 2016

(30) Foreign Application Priority Data

Nov. 23, 2015 (KR) .................. 10-2015-0163846

(51) Int. Cl.
| | |
|---|---|
| H01L 29/00 | (2006.01) |
| H01L 29/78 | (2006.01) |
| H01L 29/10 | (2006.01) |
| H01L 29/06 | (2006.01) |
| H01L 29/423 | (2006.01) |

(Continued)

(52) U.S. Cl.
CPC ....... *H01L 29/7816* (2013.01); *H01L 29/0615* (2013.01); *H01L 29/1095* (2013.01); *H01L 29/402* (2013.01); *H01L 29/42368* (2013.01); *H01L 29/66681* (2013.01); *H01L 29/7835* (2013.01)

(58) Field of Classification Search
CPC ........... H01L 29/1095; H01L 29/42368; H01L 29/402; H01L 29/7816; H01L 29/7835; H01L 29/66681
See application file for complete search history.

(56) References Cited

U.S. PATENT DOCUMENTS

| | | | | |
|---|---|---|---|---|
| 2009/0289312 | A1* | 11/2009 | Mori ..................... | H01L 27/088 257/409 |
| 2010/0025763 | A1* | 2/2010 | Paul .................... | H01L 29/0634 257/343 |

(Continued)

FOREIGN PATENT DOCUMENTS

| | | |
|---|---|---|
| KR | 1020010062630 | 7/2001 |
| KR | 1020080113765 | 12/2008 |

(Continued)

*Primary Examiner* — Ngan Ngo
(74) *Attorney, Agent, or Firm* — IP & T Group LLP

(57) ABSTRACT

A high voltage integrated device includes a semiconductor layer having a first conductivity, a source region having a second conductivity and a drift region having the second conductivity which are disposed in the semiconductor layer and spaced apart from each other by a channel region, a drain region having the second conductivity and disposed in the drift region, a gate insulation layer disposed over the channel region, a first field insulation layer and a second field insulation layer which are disposed over the drift region and between the channel region and the drain region, wherein the first field insulation layer and the second field insulation layer are spaced apart from each other, an insulation layer disposed over the drift region and located between the first and second field insulation layers, and a gate electrode disposed over the gate insulation layer, the first field insulation layer, the insulation layer, and the second field insulation layer, wherein the first field insulation layer is adjacent to the channel region and the second field insulation layer is adjacent to the drain region.

18 Claims, 7 Drawing Sheets

(51) Int. Cl.
*H01L 29/40* (2006.01)
*H01L 29/66* (2006.01)

(56) References Cited

U.S. PATENT DOCUMENTS

| | | | |
|---|---|---|---|
| 2011/0278650 A1* | 11/2011 | Tamaki | H01L 29/66681 257/288 |
| 2012/0098064 A1* | 4/2012 | Onishi | H01L 29/0619 257/341 |
| 2013/0161740 A1 | 6/2013 | Disney et al. | |
| 2014/0225114 A1* | 8/2014 | Furukawa | H01L 29/66068 257/48 |
| 2015/0325693 A1* | 11/2015 | Mori | H01L 29/7816 257/339 |
| 2015/0357404 A1* | 12/2015 | Sato | H01L 29/404 257/339 |
| 2016/0133704 A1* | 5/2016 | Karino | H01L 29/808 257/272 |
| 2016/0240658 A1* | 8/2016 | Kim | H01L 29/7816 |

FOREIGN PATENT DOCUMENTS

| KR | 1020110078531 | 7/2011 |
|---|---|---|
| KR | 1020130073776 | 7/2013 |

\* cited by examiner

HIGH VOLTAGE INTEGRATED CIRCUITS HAVING IMPROVED ON-RESISTANCE VALUE AND IMPROVED BREAKDOWN VOLTAGE

CROSS-REFERENCE TO RELATED APPLICATION

The present application claims priority under 35 U.S.C 119(a) to Korean Patent Application No. 10-2015-0163846, filed on Nov. 23, 2015, which is herein incorporated by references in its entirety.

BACKGROUND

1. Technical Field

Various embodiments of the present disclosure relate to high voltage integrated devices and, more particularly, to high voltage integrated devices having an improved on-resistance value and an improved breakdown voltage.

2. Related Art

Integrated devices having functions of both a controller and a driver are referred to as smart power devices. In general, output circuits of the smart power devices may be designed to include high voltage integrated devices such as lateral double diffused MOS (LDMOS) transistors operating at high voltages. In the high voltage integrated devices, breakdown voltages of the LDMOS transistors, for example, a drain junction breakdown voltage and a gate dielectric breakdown voltage are important factors that directly influence the stable operation of the LDMOS transistors. In addition, an on-resistance (Ron) value of the LDMOS transistors is also an important factor that influences electrical characteristics of the LDMOS transistors, for example, a current drivability of the LDMOS transistors.

In order to improve the drain junction breakdown voltage of the LDMOS transistors, a doping concentration of a drift region between a drain region and a channel region has to be reduced or a drift length of carriers in the drift region corresponding to a length of a current path in the drift region has to be increased. However, in such a case, the current drivability of the LDMOS transistors may be degraded and the on-resistance (Ron) of the LDMOS transistors increases.

On the contrary, if the doping concentration of the drift region between the drain region and the channel region increases or the drift length in the drift region decreases, the on-resistance (Ron) of the LDMOS transistors may be reduced and the current drivability of the LDMOS transistors may improve. However, the drain junction breakdown voltages of the LDMOS transistors may be lowered. That is, in the LDMOS transistors, the on-resistance and the drain junction breakdown voltage may be in a trade-off relationship.

SUMMARY

Various embodiments are directed to high voltage integrated devices having an improved on-resistance value and an Improved breakdown voltage.

According to an embodiment, a high voltage integrated device includes a semiconductor layer having a first conductivity, a source region having a second conductivity and a drift region having the second conductivity which are disposed in the semiconductor layer and spaced apart from each other by a channel region, a drain region having the second conductivity and disposed in the drift region, a gate insulation layer disposed over the channel region, a first field insulation layer and a second field insulation layer which are disposed over the drift region and between the channel region and the drain region, wherein the first field insulation layer and the second field insulation layer are spaced apart from each other, an insulation layer disposed over the drift region and located between the first and second field insulation layers, and a gate electrode disposed over the gate insulation layer, the first field insulation layer, the insulation layer, and the second field insulation layer, wherein the first field insulation layer is adjacent to the channel region and the second field insulation layer is adjacent to the drain region.

According to another embodiment, a high voltage integrated device includes a semiconductor layer having a first conductivity, a source region having a second conductivity and a drift region having the second conductivity which are disposed in the semiconductor layer and spaced apart from each other by a channel region, a drain region having the second conductivity and disposed in the drift region, a gate insulation layer disposed over the channel region, at least three field insulation layers disposed over the drift region and between the channel region and the drain region, wherein the field insulation layers are spaced apart from each other, insulation layers each disposed over the drift region and each located between the field insulation layers, and a gate electrode disposed over the gate insulation layer, the field insulation layers, and the Insulation layers.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
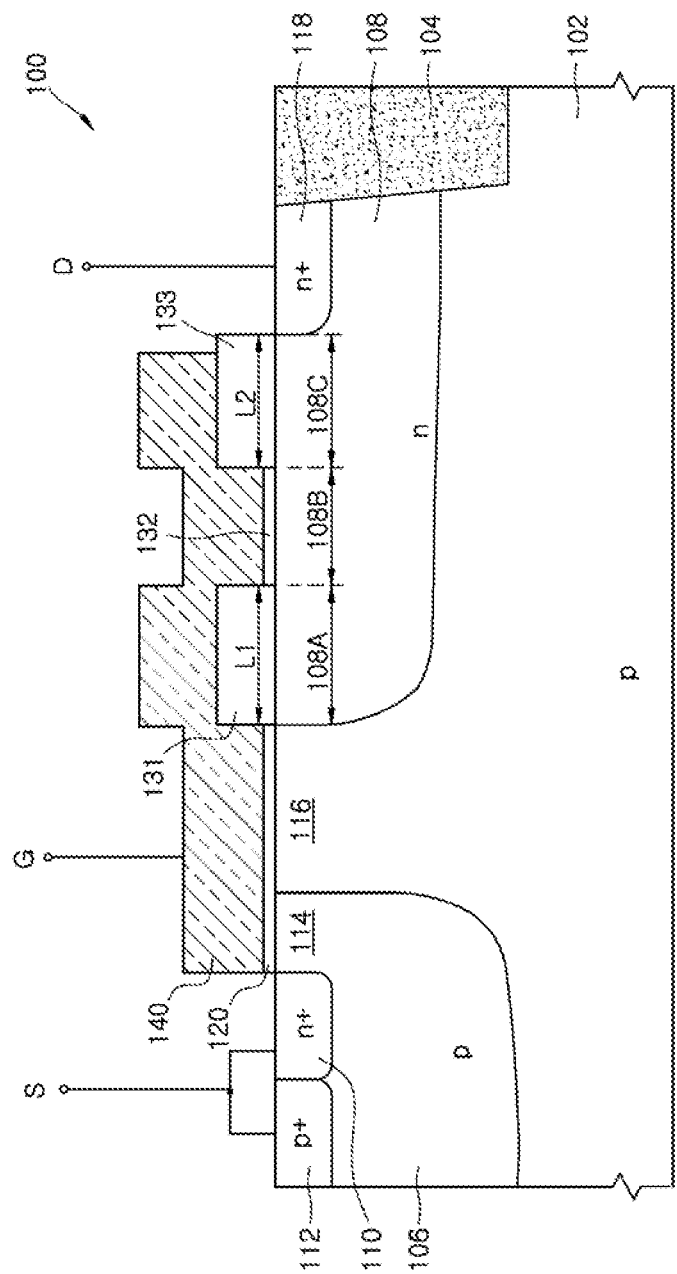
FIG. 1 is a cross-sectional view illustrating a high voltage integrated device according to an embodiment.

FIG. 1 is a cross-sectional view illustrating a high voltage integrated device 100 according to an embodiment. Referring to FIG. 1, the high voltage integrated device 100 may be a lateral double diffused MOS (LDMOS) transistor. The high voltage integrated device 100 may include a semiconductor layer 102 of a first conductivity type, for example, a P-type semiconductor layer. In an embodiment, the P-type semiconductor layer 102 may be a substrate doped with P-type impurities. In another embodiment, the P-type semiconductor layer 102 may be a P-type diffusion layer disposed in a substrate. In yet another embodiment, the P-type semiconductor layer 102 may be a P-type epitaxial layer grown on a substrate. The P-type semiconductor layer 102 may have an active region defined by a trench isolation layer 104.

A P-type body region 106 may be disposed in a first upper portion of the P-type semiconductor layer 102. An N-type source region 110 and a P-type body contact region 112 may be disposed in an upper portion of the P-type body region 106. A sidewall of the N-type source region 110 may be in direct contact with a sidewall of the P-type body contact region 112. A first channel region 114 is formed in an upper portion of the P-type body region 106 adjacent to another sidewall of the N-type source region 110 opposite to the P-type body contact region 112.

The N-type source region 110 and the P-type body contact region 112 may be electrically connected to a source terminal S in common. A drift region 108 of a second conductivity type, for example, an N-type drift region may be disposed in a second upper portion of the P-type semiconductor layer 102. The N-type drift region 108 may be disposed spaced apart from the P-type body region 106. An upper portion of the P-type semiconductor layer 102 between the P-type body region 106 and the N-type drift region 108 may correspond to a second channel region 116.

The first channel region 114 and the second channel region 116, in combination, may constitute a channel region. A length of the channel region may correspond to a distance between the N-type source region 110 and the N-type drift region 108. That is, the length of the channel region may be a sum of a length of the first channel region 114 and a length of the second channel region 116.

An N-type drain region 118 may be disposed in an upper portion of the N-type drift region 108. The N-type drain region 118 may be electrically connected to a drain terminal D. A top surface of the channel region 114+116 may be coplanar with a top surface of the N-type drift region 108.

A gate insulation layer 120 may be disposed on the first and second channel regions 114 and 116. A first insulation layer 131, a second insulation layer 132 and a third insulation layer 133 may be laterally disposed on the N-type drift region 108 and between the second channel region 116 and the N-type drain region 118. A sidewall of the first insulation layer 131 may be in direct contact with a sidewall of the gate insulation layer 120. The sidewall of the first insulation layer 131, which is in direct contact with the gate insulation layer 120, may be aligned with a sidewall of the N-type drift region 108 which is in contact with the second channel region 116.

Another sidewall of the first insulation layer 131 opposite to the gate insulation layer 120 may be in direct contact with a sidewall of the second insulation layer 132. Another sidewall of the second insulation layer 132 opposite to the first insulation layer 131 may be in direct contact with a sidewall of the third insulation layer 133. Another sidewall of the third insulation layer 133 opposite to the second insulation layer 132 may be aligned with a sidewall of the N-type drain region 118.

In an embodiment, the second insulation layer 132 may have substantially the same thickness as the gate insulation layer 120. In another embodiment, the second insulation layer 132 may have a thickness which is greater than a thickness of the gate insulation layer 120. The first insulation layer 131 may have substantially the same thickness as the third insulation layer 133, and the first and third insulation layers 131 and 133 may be thicker than the second insulation layer 132. In an embodiment, each of the first and third insulation layers 131 and 133 may be at least thirty times thicker than that of the second insulation layer 132.

While the first and third insulation layers 131 and 133 serve as field insulation layers, the second insulation layer 132 may serve as the gate insulation layer 120 so that carriers for example, electrons are accumulated in an upper portion of the N-type drift region 108 when the high voltage integrated device 100 is turned on. A first length L1 of the first insulation layer 131, which is measured along a channel length direction, may be substantially equal to a second length L2 of the third insulation layer 133, which is measured along the channel length direction. In an embodiment, each of the first and third insulation layers 131 and 133 may include a dielectric layer such as a high temperature oxide (HTO) layer.

An upper portion of the N-type drift region 108 between the second channel region 116 and the N-type drain region 118 may be divided into a first N-type drift region 108A, a second N-type drift region 108B and a third N-type drift region 108C. The first N-type drift region 108A may vertically overlap with the first insulation layer 131 and may contact the second channel region 116. The third N-type drift region 108C may vertically overlap with the third insulation layer 133 and may contact the N-type drain region 118. The second N-type drift region 108B may vertically overlap with the second insulation layer 132 and may correspond to a region between the first N-type drift region 108A and the third N-type drift region 108C. A gate electrode 140 may be disposed on the gate insulation layer 120, the first insulation layer 131, the second insulation layer 132 and the third insulation layer 133. The gate electrode 140 may be electrically connected to a gate terminal G.

Figure 2:
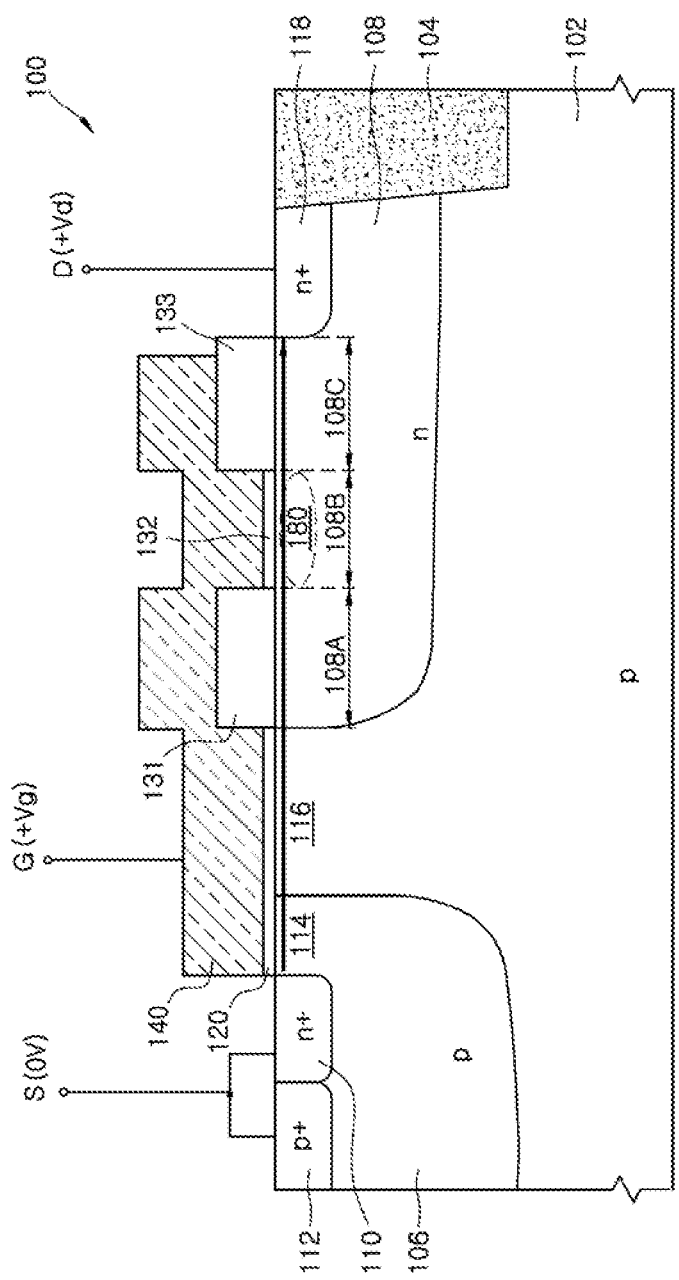
FIG. 2 is a cross-sectional view illustrating the high voltage integrated device shown in FIG. 1 in on-state.

FIG. 2 is a cross-sectional view illustrating the high voltage integrated device 100, shown in FIG. 1, in an on-state. In FIG. 2, the same reference numerals or the same reference designators as used in FIG. 1 denote the same elements. Referring to FIG. 2, when a ground voltage that is, 0V is applied to the source terminal S and a positive gate voltage that is, +Vg, which is greater than a threshold voltage, and a positive drain voltage that is, +Vd are respectively applied to the gate terminal G and the drain terminal D, the high voltage integrated device 100 may be turned on. When the high voltage integrated device 100 is turned on, a channel inversion layer may be formed in the first and second channel regions 114 and 116. In such a case, as indicated by an arrow, carriers, for example, electrons may be drifted from the N-type source region 110 toward the N-type drain region 118 through the channel inversion layer and an upper portion of the N-type drift region 108. As a result, a current may flow from the drain terminal D toward the source terminal S.

An on-resistance characteristic of the high voltage integrated device 100 may be influenced by a length of a current path in the N-type drift region 108 and a doping concentration that is, an impurity concentration of the N-type drift region 108. For example, if a length of a movement path of electrons in the N-type drift region 108 is reduced, the on-resistance characteristic of the high voltage integrated device 100 may be improved. On the contrary, if a length of a movement path of electrons in the N-type drift region 108 increases, the on-resistance characteristic of the high voltage integrated device 100 may be degraded. In addition, if a doping concentration of the N-type drift region 108 increases, the on-resistance characteristic of the high voltage integrated device 100 may be improved. In contrast, if a doping concentration of the N-type drift region 108 is lowered, the on-resistance characteristic of the high voltage integrated device 100 may be degraded.

An increase of a drift length of electrons in the N-type drift region 108 may lead to an increase of a planar area that the high voltage integrated device 100 occupies. Thus, the increase of a drift length of electrons in the N-type drift region 108 may not be suitable for highly integrated semiconductor devices. When a doping concentration of the N-type drift region 108 increases, the on-resistance characteristic of the high voltage integrated device 100 may be improved. However, in such a case, a drain junction breakdown voltage characteristic of the high voltage integrated device 100 may be degraded.

According to the embodiment, when the positive gate voltage +Vg is applied to the gate terminal G, an accumulation layer 180 may be formed in the second N-type drift region 108B and below the second insulation layer 132. A concentration of N-type impurities in the accumulation layer 180 may be greater than a concentration of N-type impurities in the other regions of the N-type drift region 108. Thus, when the high voltage integrated device 100 is turned on to provide the accumulation layer 180, an amount of electrons drifted from the N-type source region 110 toward the N-type drain region 118 may increase to improve the on-resistance characteristic of the high voltage integrated device 100. Even though the concentration of the N-type impurities in the accumulation layer 180 increases while the high voltage integrated device 100 is turned on, a concentration of N-type impurities in the N-type drift region 108 adjacent to a junction between the P-type semiconductor layer 102 and the N-type drift region 108 may not increase due to the presence of the first and third insulation layers 131 and 133 particularly, the first Insulation layer 131, which serve as field insulation layers. Thus, a junction breakdown voltage characteristic of the N-type drift region 108 may not be degraded.

Figure 3:
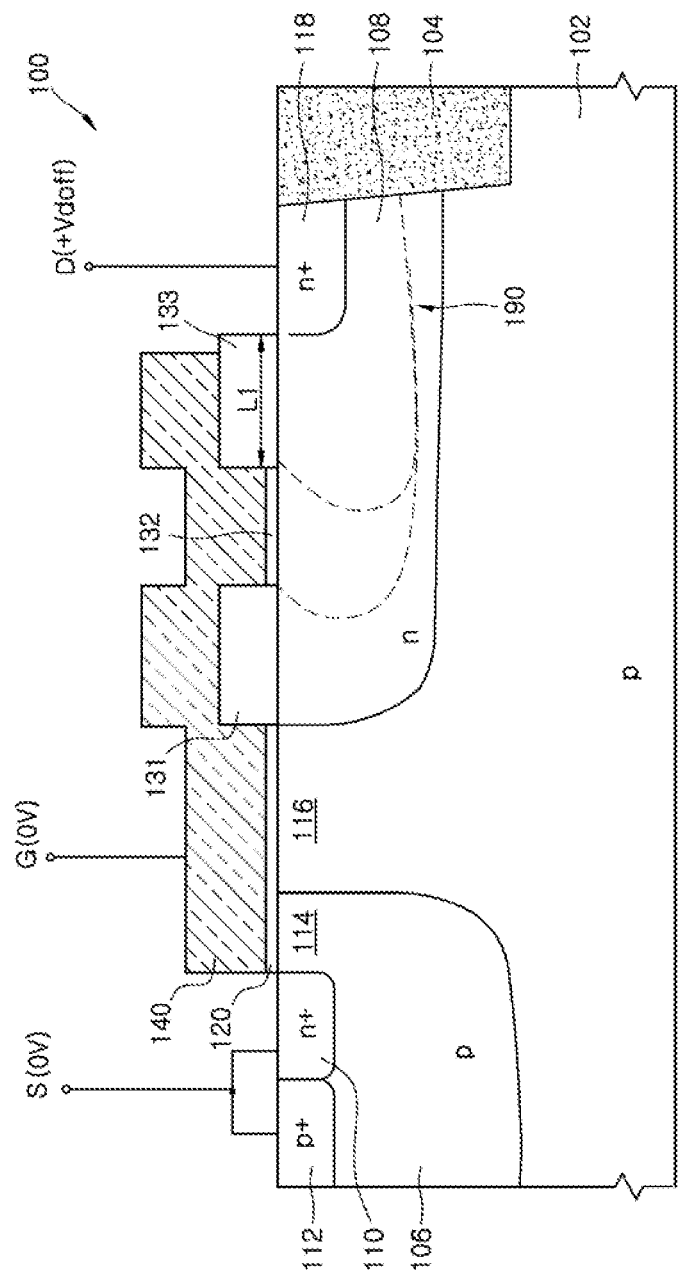
FIG. 3 is a cross-sectional view illustrating the high voltage integrated device shown in FIG. 1 in off-state.

FIG. 3 is a cross-sectional view illustrating an off-state of the high voltage integrated device 100 shown in FIG. 1. In FIG. 3, the same reference numerals or the same reference designators as used in FIG. 1 denote the same elements. Referring to FIG. 3, when a ground voltage that is, 0V is applied to the source terminal S and the gate terminal G and a positive drain off voltage that is, +Vdoff is applied to the drain terminal D, the high voltage integrated device 100 may be turned off. In such a case, since a reverse bias is applied across a P-N junction between the P-type semiconductor layer 102 and the N-type drift region 108, the P-type semiconductor layer 102 and the N-type drift region 108 adjacent to the P-N junction may be depleted. In such a case, as indicated by dotted lines 190, a depletion region in the N-type drift region 108 and below the second insulation layer 132 may be widened to improve the junction breakdown voltage characteristic of the N-type drift region 108 when the high voltage integrated device 100 is turned off.

Figure 4:
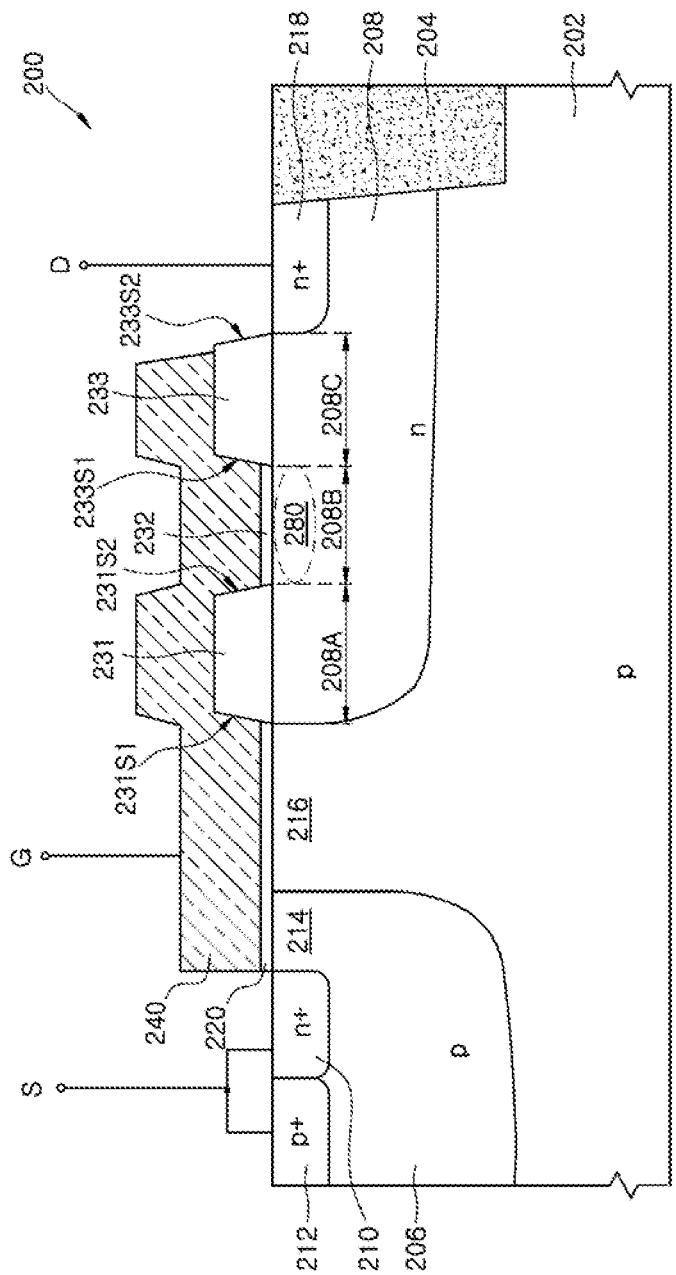
FIG. 4 is a cross-sectional view illustrating a high voltage integrated device according to another embodiment.

FIG. 4 is a cross-sectional view illustrating a high voltage integrated device 200 according to another embodiment. Referring to FIG. 4, the high voltage integrated device 200 may include a semiconductor layer 202 of a first conductivity type, for example, a P-type semiconductor layer. In an embodiment, the P-type semiconductor layer 202 may be a substrate doped with P-type impurities. In another embodiment, the P-type semiconductor layer 202 may be a P-type diffusion layer disposed in a substrate. In yet another embodiment, the P-type semiconductor layer 202 may be a P-type epitaxial layer grown on a substrate. The P-type semiconductor layer 202 may have an active region defined by a trench isolation layer 204.

A P-type body region 206 may be disposed in a first upper portion of the P-type semiconductor layer 202. An N-type source region 210 and a P-type body contact region 212 may be disposed in an upper portion of the P-type body region 206. A sidewall of the N-type source region 210 may be in direct contact with a sidewall of the P-type body contact region 212. An upper portion of the P-type body region 206 adjacent to another sidewall of the N-type source region 210 opposite to the P-type body contact region 212 may correspond to a first channel region 214.

The N-type source region 210 and the P-type body contact region 212 may be electrically connected in common to a source terminal S. A drift region 208 of a second conductivity type, for example, an N-type drift region may be disposed in a second upper portion of the P-type semiconductor layer 202. The N-type drift region 208 may be disposed spaced apart from the P-type body region 206.

An upper portion of the P-type semiconductor layer 202 between the P-type body region 206 and the N-type drift region 208 may correspond to a second channel region 216. The first channel region 214 and the second channel region 216, in combination, may constitute a channel region. A length of the channel region may correspond to a distance between the N-type source region 210 and the N-type drift region 208. That is, the length of the channel region may be a sum of a length of the first channel region 214 and a length of the second channel region 216. An N-type drain region 218 may be disposed in an upper portion of the N-type drift region 208. The N-type drain region 218 may be electrically connected to a drain terminal D.

A gate insulation layer 220 may be disposed on the first and second channel regions 214 and 216. A first insulation layer 231, a second insulation layer 232 and a third insulation layer 233 may be laterally disposed, that is, in a side by side manner, on the N-type drift region 208 between the second channel region 216 and the N-type drain region 218. The first insulation layer 231 may have a first sidewall 231S1 and a second sidewall 231S2 which are spaced apart from each other along a channel length direction and are opposite to each other. The first sidewall 231S1 of the first insulation layer 231 may be in direct contact with a sidewall of the gate insulation layer 220. The first sidewall 231S1 of the first insulation layer 231 may be aligned with a sidewall of the N-type drift region 208 which is in contact with the second channel region 216. The second sidewall 231S2 of the first insulation layer 231 may be in direct contact with a sidewall of the second insulation layer 232.

The first sidewall 231S1 and the second sidewall 231S2 of the first insulation layer 231 may have a sloped profile. That is, the first sidewall 231S1 and the second sidewall 231S2 of the first insulation layer 231 may have a positive sloped profile so that a length of the first insulation layer 231 in the channel length direction is gradually reduced upward from a top surface of the N-type drift region 208.

The third insulation layer 233 may have a first sidewall 233S1 and a second sidewall 233S2 which are spaced apart from each other along the channel length direction and are opposite to each other. The first sidewall 233S1 of the third insulation layer 233 may be in direct contact with another sidewall of the second insulation layer 232 opposite to the first Insulation layer 231. The second sidewall 233S2 of the third insulation layer 233 may be aligned with a sidewall of the N-type drain region 218.

The first sidewall 233S1 and the second sidewall 233S2 of the third insulation layer 233 may have a sloped profile. That is, the first sidewall 233S1 and the second sidewall 233S2 of the third insulation layer 233 may have a positive sloped profile so that a length of the third insulation layer 233 in the channel length direction is gradually reduced upward from a top surface of the N-type drift region 208. Since the sidewalls of the first and third insulation layers 231 and 233 have a positive sloped profile, an electric field across an edge of the gate insulation layer 220 adjacent to the first insulation layer 231 as well as electric fields across both edges of the second insulation layer 232 adjacent to the first and second insulation layers 231 and 233 may be lowered.

In an embodiment, the second insulation layer 232 may have substantially the same thickness as the gate insulation layer 220. In another embodiment, the second insulation layer 232 may have a thickness which is greater than a thickness of the gate insulation layer 220. The first insulation layer 231 may have substantially the same thickness as the third insulation layer 233, and the first and third Insulation layers 231 and 233 may be thicker than the second insulation layer 232.

In an embodiment, each of the first and third insulation layers 231 and 233 may be at least thirty times thicker than that of the second insulation layer 232. While the first and third insulation layers 231 and 233 serve as field insulation layers, the second insulation layer 232 may serve as the gate insulation layer 220 so that carriers for example, electrons are accumulated in an upper portion of the N-type drift region 208 when the high voltage integrated device 200 is turned on.

A length of the first insulation layer 231 in the channel length direction may be substantially equal to a length of the third insulation layer 233 in the channel length direction. In an embodiment, the first and third insulation layers 231 and 233 may include a dielectric layer such as a high temperature oxide (HTO) layer.

An upper portion of the N-type drift region 208 between the second channel region 216 and the N-type drain region 218 may be divided into a first N-type drift region 208A, a second N-type drift region 208B and a third N-type drift region 208C. The first N-type drift region 208A may vertically overlap with the first insulation layer 231 and may contact the second channel region 216. The third N-type drift region 208C may vertically overlap with the third insulation layer 233 and may contact the N-type drain region 218. The second N-type drift region 208B may vertically overlap with the second insulation layer 232 and may correspond to a region between the first N-type drift region 208A and the third N-type drift region 208C.

When the high voltage integrated device 200 is turned on, an accumulation layer 280 may be formed in an upper portion of the second N-type drift region 208B and reduce an on-resistance value of the high voltage integrated device 200. A gate electrode 240 may be disposed on the gate insulation layer 220, the first insulation layer 231, the second insulation layer 232 and the third insulation layer 233. The gate electrode 240 may be electrically connected to a gate terminal G.

Figure 5:
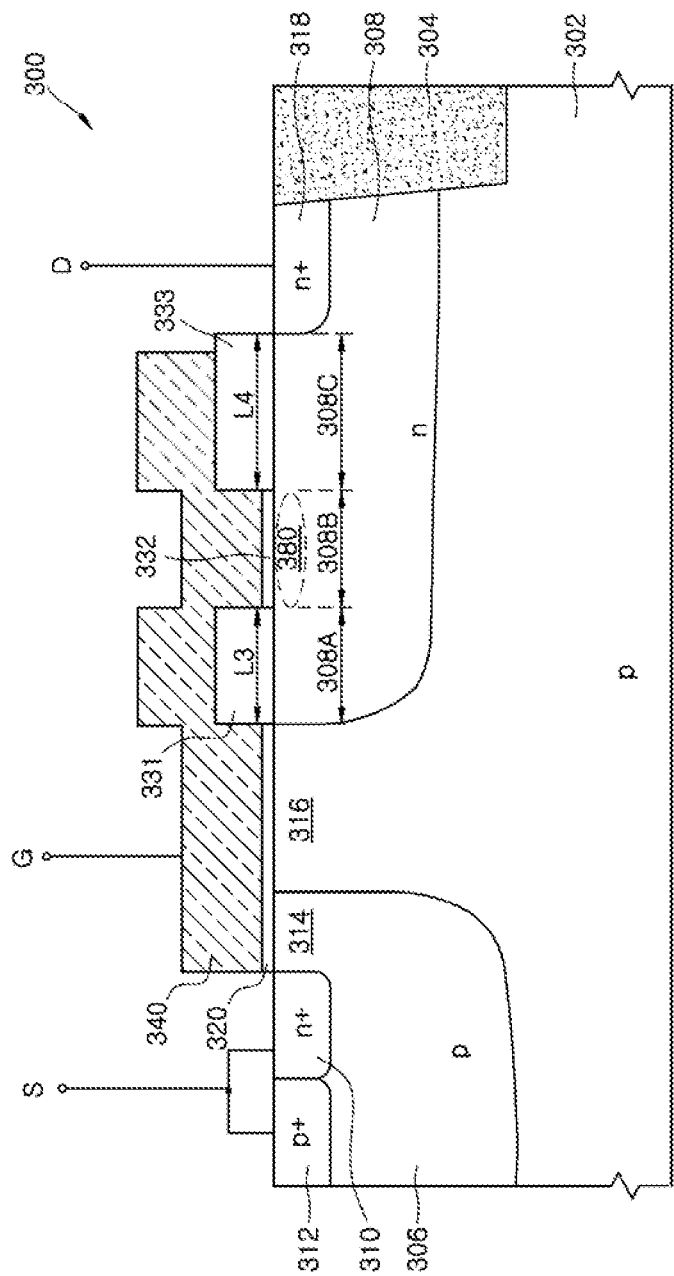
FIG. 5 is a cross-sectional view illustrating a high voltage integrated device according to yet another embodiment.

FIG. 5 is a cross-sectional view illustrating a high voltage integrated device 300 according to yet another embodiment. Referring to FIG. 5, the high voltage integrated device 300 may include a semiconductor layer 302 of a first conductivity type, for example, a P-type semiconductor layer. In an embodiment, the P-type semiconductor layer 302 may be a substrate doped with P-type impurities. In another embodiment, the P-type semiconductor layer 302 may be a P-type diffusion layer disposed in a substrate. In yet another embodiment, the P-type semiconductor layer 302 may be a P-type epitaxial layer grown on a substrate. The P-type semiconductor layer 302 may have an active region defined by a trench isolation layer 304.

A P-type body region 306 may be disposed in a first upper portion of the P-type semiconductor layer 302. An N-type source region 310 and a P-type body contact region 312 may be disposed in an upper portion of the P-type body region 306. A sidewall of the N-type source region 310 may be in direct contact with a sidewall of the P-type body contact region 312. An upper portion of the P-type body region 306 adjacent to another sidewall of the N-type source region 310 opposite to the P-type body contact region 312 may correspond to a first channel region 314. The N-type source region 310 and the P-type body contact region 312 may be electrically connected in common to a source terminal S.

A drift region 308 of a second conductivity type, for example, an N-type drift region may be disposed in a second upper portion of the P-type semiconductor layer 302. The N-type drift region 308 may be disposed spaced apart from the P-type body region 306. An upper portion of the P-type semiconductor layer 302 between the P-type body region 306 and the N-type drift region 308 may correspond to a second channel region 316.

The first channel region 314 and the second channel region 316, in combination, may constitute a channel region. A length of the channel region may correspond to a distance between the N-type source region 310 and the N-type drift region 308. That is, the length of the channel region may be a sum of a length of the first channel region 314 and a length of the second channel region 316. An N-type drain region 318 may be disposed in an upper portion of the N-type drift region 308. The N-type drain region 318 may be electrically connected to a drain terminal D.

A gate insulation layer 320 may be disposed on the first and second channel regions 314 and 316. A first insulation layer 331, a second insulation layer 332 and a third insulation layer 333 may be laterally disposed on the N-type drift region 308 between the second channel region 316 and the N-type drain region 318.

A sidewall of the first insulation layer 331 may be in direct contact with a sidewall of the gate insulation layer 320. The sidewall of the first insulation layer 331, which is in direct contact with the gate insulation layer 320, may be aligned with a sidewall of the N-type drift region 308 which is in contact with the second channel region 316. Another sidewall of the first insulation layer 331 opposite to the gate insulation layer 320 may be in direct contact with a sidewall of the second insulation layer 332.

Another sidewall of the second insulation layer 332 opposite to the first insulation layer 331 may be in direct contact with a sidewall of the third insulation layer 333. Another sidewall of the third insulation layer 333 opposite to the second insulation layer 332 may be aligned with a sidewall of the N-type drain region 318. Although not shown in FIG. 5, both sidewalls of each of the first and third insulation layers 331 and 333 may have a positive sloped profile, as described with reference to FIG. 4.

In an embodiment, the second insulation layer 332 may have substantially the same thickness as the gate insulation layer 320. In another embodiment, the second insulation layer 332 may have a thickness which is greater than a thickness of the gate insulation layer 320. The first insulation layer 331 may have substantially the same thickness as the third insulation layer 333, and each of the first and third insulation layers 331 and 333 may be thicker than the second insulation layer 332.

In an embodiment, each of the first and third insulation layers 331 and 333 may be at least thirty times thicker than that of the second insulation layer 332. While the first and third insulation layers 331 and 333 serve as field insulation layers, the second insulation layer 332 may serve as the gate insulation layer 320 so that carriers for example, electrons are accumulated in an upper portion of the N-type drift region 308 when the high voltage integrated device 300 is turned on.

A first length L3 of the first insulation layer 331 in a channel length direction may be less than a second length L4 of the third insulation layer 333 in the channel length direction. In an embodiment, the second length L4 of the third insulation layer 333 may be at least 1.2 times longer than the first length L3 of the first insulation layer 331.

When the second length L4 of the third insulation layer 333 adjacent to the N-type drain region 318 increases, an electric field created across the second insulation layer 332 having a relatively reduced thickness may be lowered when the high voltage integrated device 300 operates. Thus, an allowable maximum gate voltage and/or an allowable maximum drain voltage may increase without breakdown of the second insulation layer 332. In an embodiment, the first and third insulation layers 331 and 333 may include a dielectric layer such as a high temperature oxide (HTO) layer.

An upper portion of the N-type drift region 308 between the second channel region 316 and the N-type drain region 318 may be divided into a first N-type drift region 308A, a second N-type drift region 308B and a third N-type drift region 308C. The first N-type drift region 308A may vertically overlap with the first insulation layer 331 and may contact the second channel region 316. The third N-type drift region 308C may vertically overlap with the third insulation layer 333 and may contact the N-type drain region 318. The second N-type drift region 308B may vertically overlap with the second insulation layer 332 and may correspond to a region between the first N-type drift region 308A and the third N-type drift region 308C.

When the high voltage integrated device 300 is turned on, an accumulation layer 380 may be formed in an upper portion of the second N-type drift region 308B and reduce an on-resistance value of the high voltage integrated device 300. A gate electrode 340 may be disposed on the gate insulation layer 320, the first insulation layer 331, the second insulation layer 332 and the third insulation layer 333. The gate electrode 340 may be electrically connected to a gate terminal G.

Figure 6:
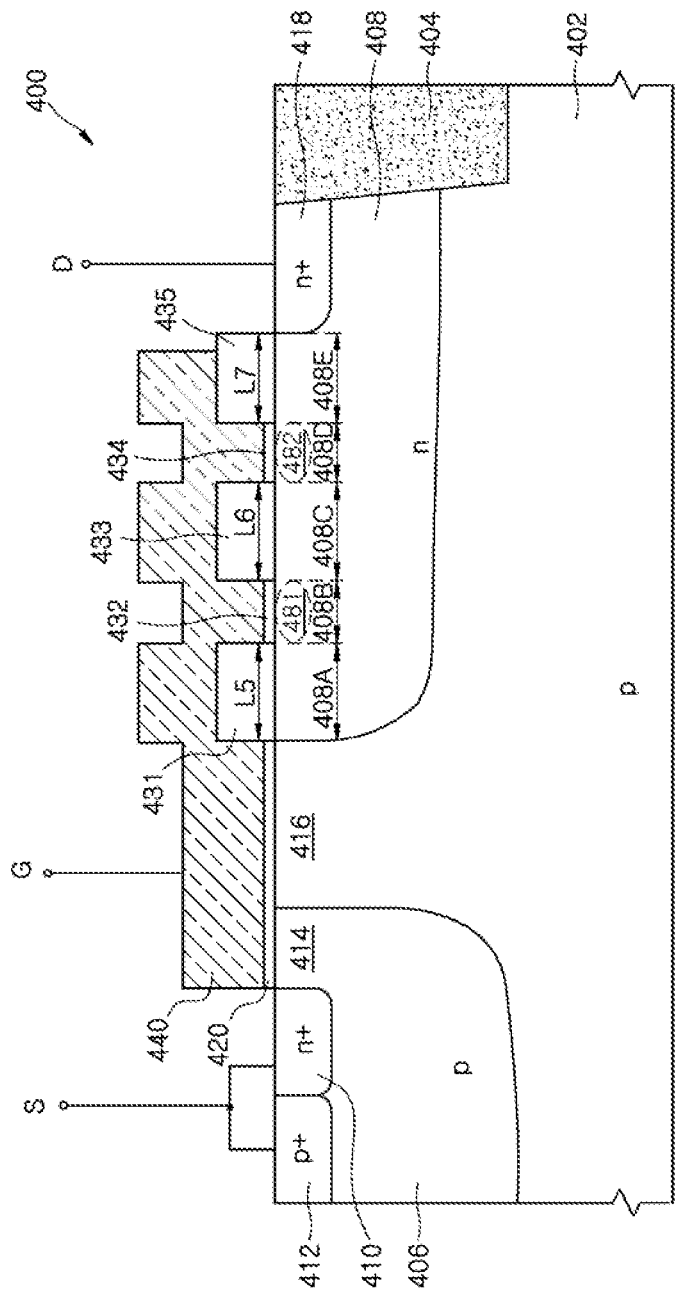
FIG. 6 is a cross-sectional view illustrating a high voltage integrated device according to still another embodiment.

FIG. 6 is a cross-sectional view illustrating a high voltage integrated device 400 according to still another embodiment.

Referring to FIG. 6, the high voltage integrated device 400 may include a semiconductor layer 402 of a first conductivity type, for example, a P-type semiconductor layer. In an embodiment, the P-type semiconductor layer 402 may be a substrate doped with P-type impurities. In another embodiment, the P-type semiconductor layer 402 may be a P-type diffusion layer disposed in a substrate. In yet another embodiment, the P-type semiconductor layer 402 may be a P-type epitaxial layer grown on a substrate. The P-type semiconductor layer 402 may have an active region defined by a trench isolation layer 404.

A P-type body region 406 may be disposed in a first upper portion of the P-type semiconductor layer 402. An N-type source region 410 and a P-type body contact region 412 may be disposed in an upper portion of the P-type body region 406. A sidewall of the N-type source region 410 may be in direct contact with a sidewall of the P-type body contact region 412. An upper portion of the P-type body region 406 adjacent to another sidewall of the N-type source region 410 opposite to the P-type body contact region 412 may correspond to a first channel region 414. The N-type source region 410 and the P-type body contact region 412 may be electrically connected in common to a source terminal S.

A drift region 408 of a second conductivity type, for example, an N-type drift region may be disposed in a second upper portion of the P-type semiconductor layer 402. The N-type drift region 408 may be disposed spaced apart from the P-type body region 406. An upper portion of the P-type semiconductor layer 402 between the P-type body region 406 and the N-type drift region 408 may correspond to a second channel region 416. The first channel region 414 and the second channel region 416, in combination, may constitute a channel region. A length of the channel region may correspond to a distance between the N-type source region 410 and the N-type drift region 408. That is, the length of the channel region may be a sum of a length of the first channel region 414 and a length of the second channel region 416. An N-type drain region 418 may be disposed in an upper portion of the N-type drift region 408. The N-type drain region 418 may be electrically connected to a drain terminal D.

A gate insulation layer 420 may be disposed on the first and second channel regions 414 and 416. A first insulation layer 431, a second insulation layer 432, a third insulation layer 433, a fourth insulation layer 434 and a fifth insulation layer 435 may be laterally disposed on the N-type drift region 408 and between the second channel region 416 and the N-type drain region 418. A sidewall of the first insulation layer 431 may be in direct contact with a sidewall of the gate insulation layer 420. The sidewall of the first insulation layer 431, which is in direct contact with the gate insulation layer 420, may be aligned with a sidewall of the N-type drift region 408 which is in contact with the second channel region 416.

Another sidewall of the first insulation layer 431 opposite to the gate insulation layer 420 may be in direct contact with a sidewall of the second insulation layer 432. Another sidewall of the second insulation layer 432 opposite to the first insulation layer 431 may be in direct contact with a sidewall of the third insulation layer 433. Another sidewall of the third insulation layer 433 opposite to the second insulation layer 432 may be in direct contact with a sidewall of the fourth Insulation layer 434. Another sidewall of the fourth insulation layer 434 opposite to the third insulation layer 433 may be in direct contact with a sidewall of the fifth Insulation layer 435. Another sidewall of the fifth Insulation layer 435 opposite to the fourth insulation layer 434 may be aligned with a sidewall of the N-type drain region 418. Although not shown in FIG. 6, both sidewalls of each of the first, third and fifth insulation layers 431, 433 and 435 may have positive sloped profiles, as described with reference to FIG. 4.

In an embodiment, the second and fourth Insulation layers 432 and 434 may have substantially the same thickness as the gate insulation layer 420. In another embodiment, the second and fourth Insulation layers 432 and 434 may have a thickness which is greater than a thickness of the gate insulation layer 420. The first, third and fifth Insulation layers 431, 433 and 435 may have substantially the same thickness, and the first, third and fifth insulation layers 431, 433 and 435 may be thicker than the second and fourth insulation layers 432 and 434.

In an embodiment, each of the first, third and fifth insulation layers 431, 433 and 435 may be at least thirty times thicker than the second or fourth Insulation layer 432, 434. While the first, third and fifth Insulation layers 431, 433 and 435 serve as field insulation layers, the second and fourth insulation layers 432 and 434 may serve like the gate insulation layer 420 so that carriers for example, electrons are accumulated in an upper portion of the N-type drift region 408 when the high voltage integrated device 400 is turned on.

A first length L5 of the first insulation layer 431 in a channel length direction, a second length L6 of the third insulation layer 433 in the channel length direction, and a third length L7 of the fifth insulation layer 435 in the channel length direction may be substantially equal to each other. In an embodiment, the first, third and fifth insulation layers 431, 433 and 435 may include a dielectric layer such as a high temperature oxide (HTO) layer.

An upper portion of the N-type drift region 408 between the second channel region 416 and the N-type drain region 418 may be divided into a first N-type drift region 408A, a second N-type drift region 408B, a third N-type drift region 408C, a fourth N-type drift region 408D and a fifth N-type drift region 408E. The first N-type drift region 408A may vertically overlap with the first insulation layer 431 and may contact the second channel region 416. The third N-type drift region 408C may vertically overlap with the third insulation layer 433. The fifth N-type drift region 408E may vertically overlap with the fifth insulation layer 435 and may contact the N-type drain region 418.

The second N-type drift region 408B may vertically overlap with the second insulation layer 432 and may correspond to a region between the first N-type drift region 408A and the third N-type drift region 408C. The fourth N-type drift region 408D may vertically overlap with the fourth insulation layer 434 and may correspond to a region between the third N-type drift region 408C and the fifth N-type drift region 408E.

When the high voltage integrated device 400 is turned on, a first accumulation layer 481 and a second accumulation layer 482 may be respectively formed in an upper portion of the second N-type drift region 408B and an upper portion of the fourth N-type drift region 408D. As a result, an on-resistance value of the high voltage integrated device 400 may be reduced. A gate electrode 440 may be disposed on the gate insulation layer 420, the first insulation layer 431, the second insulation layer 432, the third insulation layer 433, the fourth insulation layer 434 and the fifth insulation layer 435. The gate electrode 440 may be electrically connected to a gate terminal G.

According to the embodiment described with reference to FIG. 6, a length of the first accumulation layer 481 and a length of the second accumulation layer 482 may be controlled by appropriately adjusting a length of the second insulation layer 432 that is, a distance between the first and third insulation layers 431 and 433 and a length of the fourth insulation layer 434 that is, a distance between the third and fifth insulation layers 433 and 435. Although FIG. 6 illustrates an example in which the number of insulation layers that is, the first, third and fifth insulation layers 431, 433 and 435 serving as field insulation layers is three, the present disclosure is not limited thereto.

For example, in some embodiments, four or more insulation layers serving as field insulation layers may be disposed on the N-type drift region 408. In such a case, the insulation layers serving as field insulation layers and other insulation layers having a thickness less than a thickness of field insulation layers may be alternately disposed on the N-type drift region 408 in a channel length direction. In any case, two of the insulation layers serving as field insulation layers may be disposed adjacent to the second channel region 416 and the N-type drain region 418, respectively.

Figure 7:
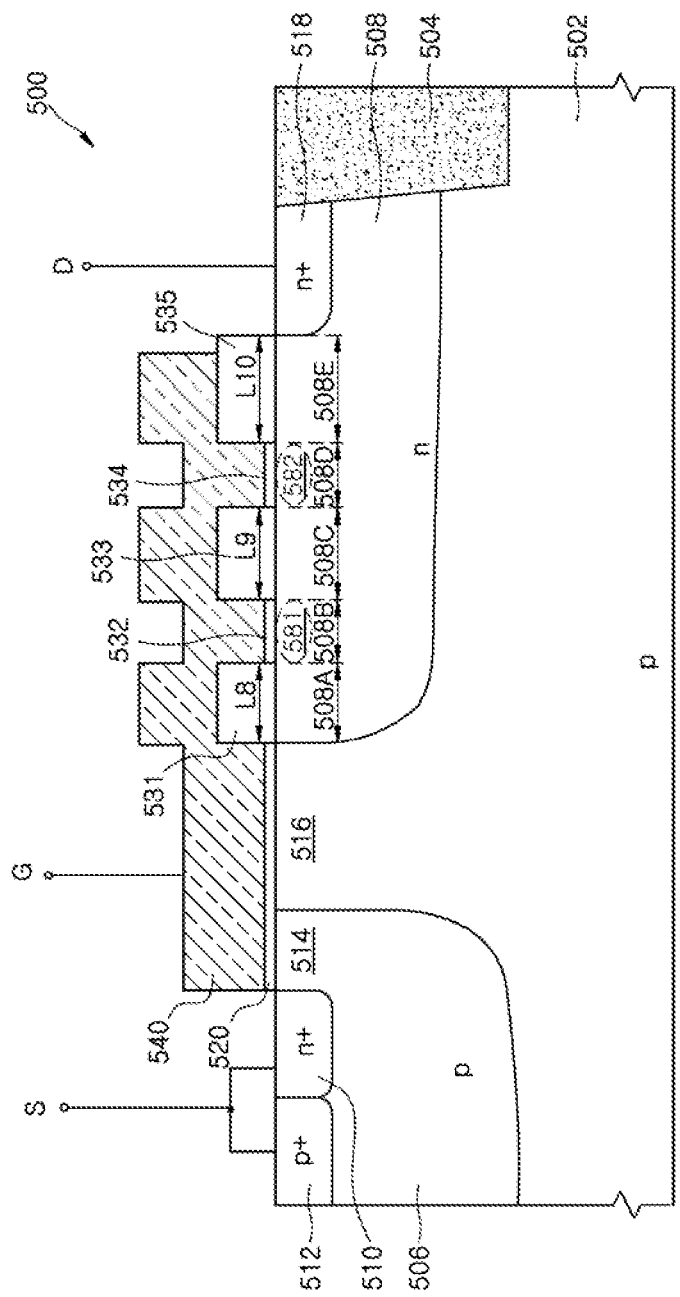
FIG. 7 is a cross-sectional view illustrating a high voltage integrated device according to yet still another embodiment.

FIG. 7 is a cross-sectional view illustrating a high voltage integrated device 500 according to yet still another embodiment. Referring to FIG. 7, the high voltage integrated device 500 may include a semiconductor layer 502 of a first conductivity type, for example, a P-type semiconductor layer. In an embodiment, the P-type semiconductor layer 502 may be a substrate doped with P-type impurities. In another embodiment, the P-type semiconductor layer 502 may be a P-type diffusion layer disposed in a substrate. In yet another embodiment, the P-type semiconductor layer 502 may be a P-type epitaxial layer grown on a substrate. The P-type semiconductor layer 502 may have an active region defined by a trench isolation layer 504.

A P-type body region 506 may be disposed in a first upper portion of the P-type semiconductor layer 502. An N-type source region 510 and a P-type body contact region 512 may be disposed in an upper portion of the P-type body region 506. A sidewall of the N-type source region 510 may be in direct contact with a sidewall of the P-type body contact region 512. An upper portion of the P-type body region 506 adjacent to another sidewall of the N-type source region 510 opposite to the P-type body contact region 512 may correspond to a first channel region 514. The N-type source region 510 and the P-type body contact region 512 may be electrically connected in common to a source terminal S.

A drift region 508 of a second conductivity type, for example, an N-type drift region may be disposed in a second upper portion of the P-type semiconductor layer 502. The N-type drift region 508 may be disposed spaced apart from the P-type body region 506. An upper portion of the P-type semiconductor layer 502 between the P-type body region 506 and the N-type drift region 508 may correspond to a second channel region 516. The first channel region 514 and the second channel region 516, in combination, may constitute a channel region.

A length of the channel region may correspond to a distance between the N-type source region 510 and the N-type drift region 508. That is, the length of the channel region may be a sum of a length of the first channel region 514 and a length of the second channel region 516. An N-type drain region 518 may be disposed in an upper portion of the N-type drift region 508. The N-type drain region 518 may be electrically connected to a drain terminal D.

A gate insulation layer 520 may be disposed on the first and second channel regions 514 and 516. A first insulation layer 531, a second insulation layer 532, a third insulation layer 533, a fourth insulation layer 534 and a fifth insulation layer 535 may be laterally disposed on the N-type drift region 508 between the second channel region 516 and the N-type drain region 518. A sidewall of the first insulation layer 531 may be in direct contact with a sidewall of the gate insulation layer 520. The sidewall of the first insulation layer 531, which is in direct contact with the gate insulation layer 520, may be aligned with a sidewall of the N-type drift region 508 which is in contact with the second channel region 516.

Another sidewall of the first Insulation layer 531 opposite to the gate insulation layer 520 may be in direct contact with a sidewall of the second insulation layer 532. Another sidewall of the second insulation layer 532 opposite to the first insulation layer 531 may be in direct contact with a sidewall of the third insulation layer 533. Another sidewall of the third insulation layer 533 opposite to the second Insulation layer 532 may be in direct contact with a sidewall of the fourth insulation layer 534.

Another sidewall of the fourth insulation layer 534 opposite to the third insulation layer 533 may be in direct contact with a sidewall of the fifth insulation layer 535. Another sidewall of the fifth insulation layer 535 opposite to the fourth insulation layer 534 may be aligned with a sidewall of the N-type drain region 518. Although not shown in FIG. 7, both sidewalls of each of the first, third and fifth insulation layers 531, 533 and 535 may have positive sloped profiles, as described with reference to FIG. 4.

In an embodiment, the second and fourth insulation layers 532 and 534 may have substantially the same thickness as the gate insulation layer 520. In another embodiment, each of the second and fourth insulation layers 532 and 534 may have a thickness which is greater than a thickness of the gate insulation layer 520. The first, third and fifth insulation layers 531, 533 and 535 may have substantially the same thickness as each other. The first, third and fifth insulation layers 531, 533 and 535 may be thicker than the second and fourth insulation layers 532 and 534.

In an embodiment, each of the first, third and fifth insulation layers 531, 533 and 535 may be at least thirty times thicker than that of the second or fourth insulation layers 532 and 534. While the first, third and fifth insulation layers 531, 533 and 535 serve as field insulation layers, the second and fourth insulation layers 532 and 534 may serve as the gate insulation layer 520 so that carriers for example, electrons are accumulated in an upper portion of the N-type drift region 508 when the high voltage integrated device 500 is turned on.

A first length L8 of the first insulation layer 531 in a channel length direction, a second length L9 of the third insulation layer 533 in the channel length direction, and a third length L10 of the fifth insulation layer 535 in the channel length direction may be different from each other. The first length L8 of the first insulation layer 531 may be less than the second length L9 of the third insulation layer 533. The third length L10 of the fifth insulation layer 535 may be greater than the second length L9 of the third insulation layer 533.

In an embodiment, the second length L9 of the third insulation layer 533 may be at least 1.2 times longer than the first length L8 of the first insulation layer 531. The third length L10 of the fifth insulation layer 535 may be at least 1.2 times longer than the second length L9 of the third insulation layer 533. Since the third length L10 of the fifth insulation layer 535 adjacent to the N-type drain region 518 is greater than the other first and second lengths L8 and L9 of the first and second insulation layers 531 and 533, an electric field created across the fourth insulation layer 534 having a relatively reduced thickness may be lowered when the high voltage integrated device 500 operates. Thus, an allowable maximum gate voltage and/or an allowable maximum drain voltage may increase without causing breakdown of the fourth insulation layer 534. In an embodiment, the first, third and fifth insulation layers 531, 533 and 535 may include a dielectric layer such as a high temperature oxide (HTO) layer.

An upper portion of the N-type drift region 508 between the second channel region 516 and the N-type drain region 518 may be divided into a first N-type drift region 508A, a second N-type drift region 508B, a third N-type drift region 508C, a fourth N-type drift region 508D and a fifth N-type drift region 508E. The first N-type drift region 508A may vertically overlap with the first insulation layer 531 and may contact the second channel region 516. The third N-type drift region 508C may vertically overlap with the third insulation layer 533. The fifth N-type drift region 508E may vertically overlap with the fifth insulation layer 535 and may contact the N-type drain region 518.

The second N-type drift region 508B may vertically overlap with the second insulation layer 532 and may correspond to a region between the first N-type drift region 508A and the third N-type drift region 508C. The fourth N-type drift region 508D may vertically overlap with the fourth insulation layer 534 and may correspond to a region between the third N-type drift region 508C and the fifth N-type drift region 508E.

When the high voltage integrated device 500 is turned on, a first accumulation layer 581 and a second accumulation layer 582 may be respectively formed in an upper portion of the second N-type drift region 508B and an upper portion of the fourth N-type drift region 508D. As a result, an on-resistance value of the high voltage integrated device 500 may be reduced. A gate electrode 540 may be disposed on the gate insulation layer 520, the first insulation layer 531, the second insulation layer 532, the third insulation layer 533, the fourth insulation layer 534 and the fifth insulation layer 535. The gate electrode 540 may be electrically connected to a gate terminal G.

According to the embodiment described with reference to FIG. 7, a length of the first accumulation layer 581 and a length of the second accumulation layer 582 may be controlled by appropriately adjusting a length of the second insulation layer 532 that is, a distance between the first and third insulation layers 531 and 533 and a length of the fourth insulation layer 534 that is, a distance between the third and fifth insulation layers 533 and 535), respectively. Although FIG. 7 illustrates an example in which the number of insulation layers that is, the first, third and fifth insulation layers 531, 533 and 535 serving as field insulation layers is three, the present disclosure is not limited thereto.

For example, in some embodiments, four or more insulation layers serving as field insulation layers may be disposed on the N-type drift region 508. In such a case, the insulation layers serving as field insulation layers and other insulation layers each having a thickness less than a thickness of field insulation layers may be alternately disposed on the N-type drift region 508 in a channel length direction. In any case, two of the insulation layers acting as field insulation layers may be disposed adjacent to the second channel region 516 and the N-type drain region 518, respectively. In addition, a length of an insulation layer serving as a field insulation layer, which is closest to the N-type drain region 518, may be greater than a length of another insulation layer serving as a field insulation layer.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A high voltage integrated device comprising:
a semiconductor layer having a first conductivity;
a source region having a second conductivity and a drift region having the second conductivity which are disposed in the semiconductor layer and spaced apart from each other by a channel region;
a drain region having the second conductivity and disposed in the drift region;
a gate insulation layer disposed over the channel region;
a first field insulation layer and a second field insulation layer which are disposed over the drift region and between the channel region and the drain region, wherein the first field insulation layer and the second field insulation layer are spaced apart from each other;
an insulation layer disposed over the drift region and located between the first and second field insulation layers; and
a gate electrode disposed over the gate insulation layer, the first field insulation layer, the insulation layer, and the second field insulation layer,
wherein the first field insulation layer is adjacent to the channel region and the second field insulation layer is adjacent to the drain region.

2. The high voltage integrated device of claim 1, further comprising:
a body region having the first conductivity, disposed in the semiconductor layer, and surrounding the source region,
wherein the body region is spaced apart from the drift region.

3. The high voltage integrated device of claim 2, wherein the channel region includes:
a first channel region defined in an upper portion of the body region and between the source region and the semiconductor layer; and
a second channel region defined in an upper portion of the semiconductor layer and between the body region and the drift region.

4. The high voltage integrated device of claim 1, wherein a top surface of the drift region is coplanar with a top surface of the channel region.

5. The high voltage integrated device of claim 1, wherein the first and second field insulation layers have substantially the same thickness.

6. The high voltage integrated device of claim 1, wherein a first sidewall of the first field insulation layer is in direct contact with a sidewall of the gate insulation layer.

7. The high voltage integrated device of claim 6, wherein the first sidewall of the first field insulation layer is aligned with a first sidewall of the drift region, and
wherein the first sidewall of the drift region is in contact with the channel region.

8. The high voltage integrated device of claim 6, wherein a first sidewall of the insulation layer is in direct contact with a second sidewall of the first field insulation layer, and
wherein a second sidewall of the insulation layer is in direct contact with a first sidewall of the second field insulation layer.

9. The high voltage integrated device of claim 8, wherein a second sidewall of the second field insulation layer is aligned with a second sidewall of the drain region.

10. The high voltage integrated device of claim 1, wherein each of the first and second field insulation layers have a sloped sidewall profile.

11. The high voltage integrated device of claim 1, wherein a length of the first field Insulation layer, which is measured in a channel length direction, is substantially equal to a length of the second field insulation layer, which is measured in the channel length direction.

12. The high voltage integrated device of claim 1, wherein a length of the second field insulation layer, which is measured in a channel length direction, is greater than a length of the first field insulation layer, which is measured in the channel length direction.

13. The high voltage integrated device of claim 12, wherein the length of the second field insulation layer is at least 1.2 times longer than the length of the first field insulation layer.

14. The high voltage integrated device of claim 1, wherein a thickness of the insulation layer is substantially equal to a thickness of the gate insulation layer.

15. The high voltage integrated device of claim 14, wherein each of the first and second field insulation layers has a thickness greater than a thickness of the insulation layer.

16. The high voltage integrated device of claim 15, wherein each of the first and second field insulation layers is at least thirty times thicker than the insulation layer.

17. The high voltage integrated device of claim 1, wherein each of the first and second field insulation layers includes a high temperature oxide (HTO) layer.

18. The high voltage integrated device of claim 1, wherein the gate insulation layer, the first field insulation layer, the insulation layer, and the second field insulation layer are arranged side by side at substantially the same level.

* * * * *